United States Patent
Rominger et al.

[11] Patent Number: 5,946,363
[45] Date of Patent: *Aug. 31, 1999

[54] DIGITAL DETECTOR CIRCUIT FOR RECOVERING THE BIT TIMING FROM A DATA STREAM

[75] Inventors: Friedrich Rominger, Brigachtal; Albrecht Rothermel, Neu-Ulm; Heinrich Schemmann, Villingen-Schwenningen, all of Germany

[73] Assignee: Deutsche Thomson-Brandt GmbH, Villingen-Schwenningen, Germany

[ * ] Notice: This patent issued on a continued prosecution application filed under 37 CFR 1.53(d), and is subject to the twenty year patent term provisions of 35 U.S.C. 154(a)(2).

[21] Appl. No.: 08/762,750

[22] Filed: Dec. 10, 1996

[30] Foreign Application Priority Data

Dec. 14, 1995 [DE] Germany .................... 195 46 632

[51] Int. Cl.$^6$ ........................................ H03D 3/24
[52] U.S. Cl. ..................... 375/376; 327/159; 327/163; 331/16
[58] Field of Search ................... 375/376, 371, 375/373, 375; 331/1 A, 16, 18, 25, 34; 455/260; 327/159, 163

[56] References Cited

U.S. PATENT DOCUMENTS

| | | | |
|---|---|---|---|
| 4,380,815 | 4/1983 | Clendening | 375/80 |
| 5,012,204 | 4/1991 | Storz et al. | 331/11 |
| 5,036,294 | 7/1991 | McCaslin | 331/1 A |
| 5,235,290 | 8/1993 | Bar-David | 331/1 A |
| 5,295,079 | 3/1994 | Wong et al. | 364/484 |
| 5,337,335 | 8/1994 | Cloetens et al. | 375/376 |
| 5,790,613 | 8/1998 | Tateishi | 375/376 |

FOREIGN PATENT DOCUMENTS

| | | | |
|---|---|---|---|
| 0 390 250 | 10/1990 | European Pat. Off. | H03L 7/087 |
| 3917217 A1 | 11/1990 | Germany | H04L 24/04 |
| 4303356 A1 | 8/1994 | Germany | H03L 7/085 |

OTHER PUBLICATIONS

German Search Report—May 24, 1996.

*Primary Examiner*—Amanda T. Le
*Attorney, Agent, or Firm*—Joseph S. Tripoli; Peter M. Emanuel; Paul P. Kiel

[57] ABSTRACT

A digital detector circuit for recovering the bit timing of a data stream with a PLL includes a digital phase detector and a digital pulse length detector whose output signals are added and integrated, and the result is used for controlling the oscillator frequency. The output signal of the pulse length detector is determined by a corresponding algorithm, one slow and two fast, with direction-dependent output signals of the pulse length detector being generated.

10 Claims, 3 Drawing Sheets

DIGITAL DETECTOR CIRCUIT FOR RECOVERING THE BIT TIMING FROM A DATA STREAM

BACKGROUND OF THE INVENTION

The invention relates to a digital detector circuit for recovering the bit timing from a data stream, an EFM data stream preferably being considered which is read during the reproduction of a CD. The digital detector circuit is in this case a component part of a phase-locked loop (PLL).

In known systems for recovering the bit timing of a data stream such as is used, for example, in data decoders for optical disks, for example CDs, the clock signal of the phase-locked loop must be locked onto or synchronized with the incoming data signal in the correct phase, so that the bit information of the data stream can be decoded. Thus, in known systems, for example in a CD player, coarse tuning until the PLL is locked on is effected by the regulation of the disk motor. On account of the mechanical inertia of the motor, this operation is relatively slow and susceptible to faults. Furthermore, the phase-locked loop only has a small capture range in conventional solutions.

The invention is therefore based on the object of realizing a bit timing detector which makes it possible to provide a PLL having an improved capture range.

BRIEF SUMMARY OF THE INVENTION

The inventive digital detector circuit for recovering the bit timing of a data stream, the detector circuit being a component part of a phase-locked loop, has a digital phase detector and a digital pulse length detector whose output signals are added and integrated, it thereby being possible to use the result as a retuning value for the oscillator frequency of the PLL.

The digital phase detector of the detector circuit according to the invention is preferably formed by a digital filter. The digital phase detector determines the phase value P in fractions of the clock period of the PLL oscillator, the phase value being defined as the phase difference between the nearest oscillator clock pulse of the PLL and a pulse of the data stream. The pulse length L of a signal of the data stream is determined in whole numbers and fractions of the clock period of the oscillator frequency of the PLL.

The pulse length L, which is expressed in numbers of the clock period of the PLL oscillator, lies between 0 and a maximum value Max, which depends on the desired resolution and on the oscillator frequency and will determine the representation of the pulse length as a digital number.

The numbers Max1, Max2, Min1, Min2 are additionally required for the general definition of the algorithm used, the following inequality being applicable:

Max>Max1>Max2> . . . >Min2>Min1>0

In this case, the above numbers are generally rational numbers.

The pulse length detector, which is an essential element of the detector circuit, has a control mechanism by means of which, depending on a predetermined function, the pulse length detector outputs one of the following three signals as a function of a predetermined function:

a) the difference from the nearest whole number of the interval [0, . . . , Max] is output;

b) the difference from the nearest whole number of a restricted interval [Max2, . . . , Min2] is output, b1) either all of the positive elements of the detected pulse lengths or b2) all of the negative elements of the detected pulse lengths being set to zero.

Furthermore, the predetermined function which controls the decision of the control mechanism consists of four comparisons, namely whether the following is true for the instantaneously determined pulse length L:

c1) $L \geq Max1$ c2) $L \geq Max2$ c3) $L < Min2$ or c4) $L < Min1$, the decision b1) being selected when the pulse length L satisfies the condition c1) in each case once for a positive and a negative pulse during a predetermined finite time, the condition b2) being selected when the pulse length L satisfies the condition c4) in each case once for a positive and a negative pulse during a predetermined finite time.

In the event of c1) occurring, this state is reversed again, that is to say output a) is selected, when a decision c3) is detected (during the state c1). Conversely, c4) is reversed, that is to say output a) is selected, when the occurrence of c2) has been detected once during the state c4).

The pulse length L is preferably realized as an 8-bit fixed point number. In this case, four bits are for the whole number part of the pulse length and four bits are for the 16ths of the pulse length, the pulse length, as already mentioned, being determined in units of the oscillator clock period. Depending on the application, it is also possible to select different limits, for example 16 bits can be used, in which case, for example, 8 bits are taken for the whole part and 8 LSB bits for the fractions.

The following values are preferably selected in the case of the above 8 bits:

Max=15 15/16

Max1=11.5

Max2=11

Min2=3

Min1=2.5

Clearly, the case of signal output a) means a relatively slower regulation of the oscillator frequency in both directions (faster, slower), whereas in the case of signal output b), that is to say the two sub-cases b1) and b2), the retuning signal assumes larger values and, therefore, the oscillator frequency is regulated rapidly in one direction (either faster or slower) until the pulse length is again in a medium range.

Furthermore, the output of the pulse length detector is set to 0 either when a defect has been detected or when the entire PLL is synchronized.

Furthermore, the output signal is multiplied by an amplification factor when the difference from the nearest whole number between 3 and 11 is output.

The pulse length detector is controllable, for example by a control unit having a $\mu$-processor or $\mu$-controller.

After the addition of the phase value and the output of the pulse length detector, the result can, if required, be multiplied by a factor of −1.

To summarize, the above circuit permits the realization of a bit timing PLL having an improved capture behaviour. Even in the event of an initially greatly mistuned oscillator frequency, the PLL locks on rapidly and afterwards has a low susceptibility to faults in the signal. Consequently, short access times are possible, which is particularly important in the case of shock-proof systems and optical disks for data applications. Due to the large capture range of the PLL according to the invention, the reading of a CLV disk with CAV is also possible. Primary applications include an application in decoders for CDs employing the EFM code. However, applications in optical media for digital video recordings and data as well as decoders for other RLL codes (codes with an upwardly and downwardly restricted run length) are also conceivable.

BRIEF DESCRIPTION OF THE SEVERAL VIEWS OF THE DRAWINGS

A preferred embodiment of the invention is described below in the drawings in which.

DETAILED DESCRIPTION OF THE INVENTION

Figure 1:
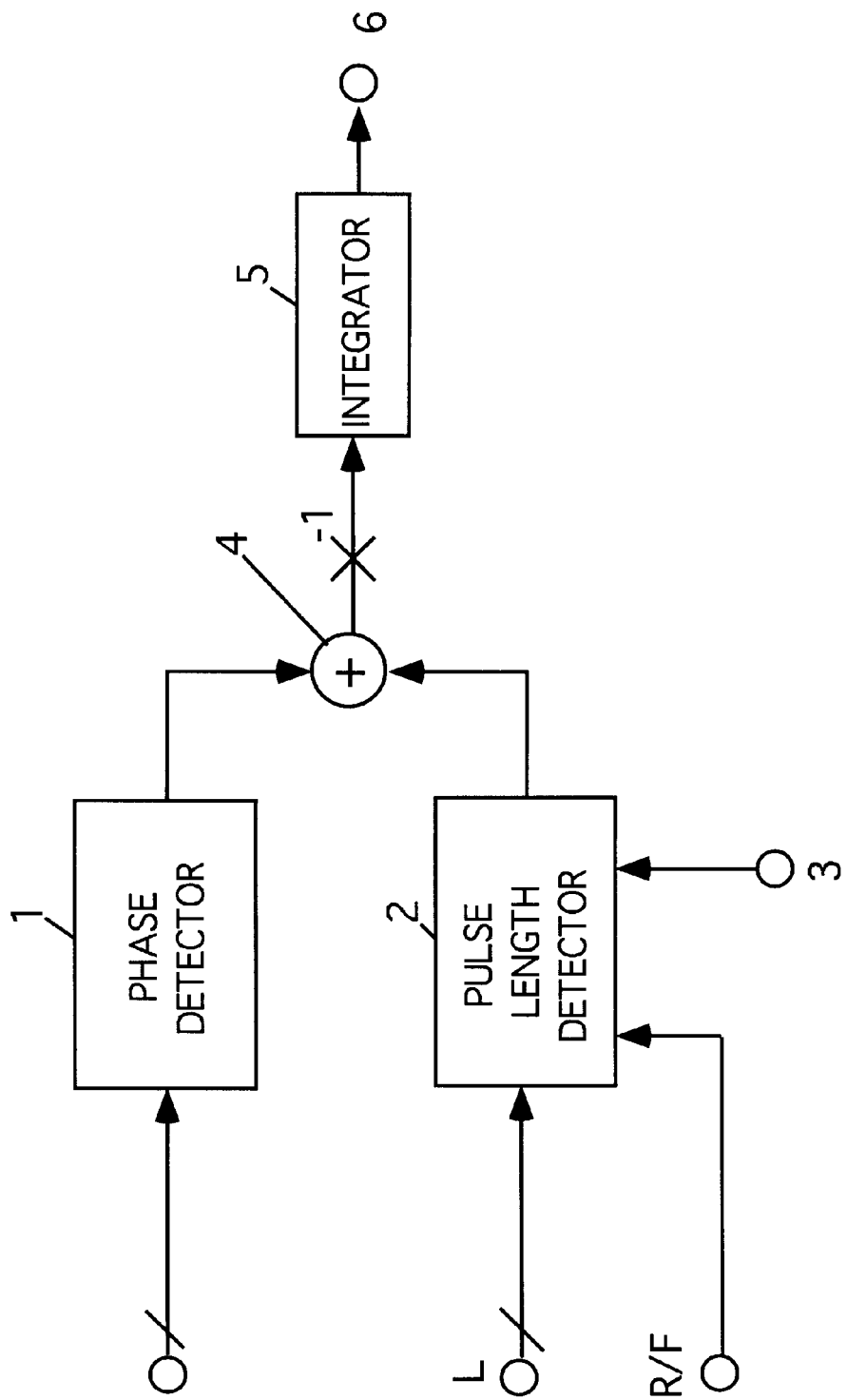
FIG. 1 shows a basic circuit diagram of the detector circuit according to the invention.

FIG. 1 shows the detector circuit according to the invention, comprising a phase-processing section having a phase detector 1, which is realized by a digital filter, phase P being fed to the phase detector 1, and a pulse length detector 2, to which the pulse length L is fed. In addition to the pulse length L, the information regarding whether the edge was rising or falling (R/F) and also a control signal 3 from a control unit (not illustrated) are fed to the pulse length detector 2. The output signals of the phase detector 1 and of the pulse length detector 2 are added in an adder 4 and the result is multiplied by a factor of −1 and fed to an integrator 5. The resulting output signal 6 of the integrator 5 is used as the retuning value of the oscillator frequency of the PLL.

Figure 2:
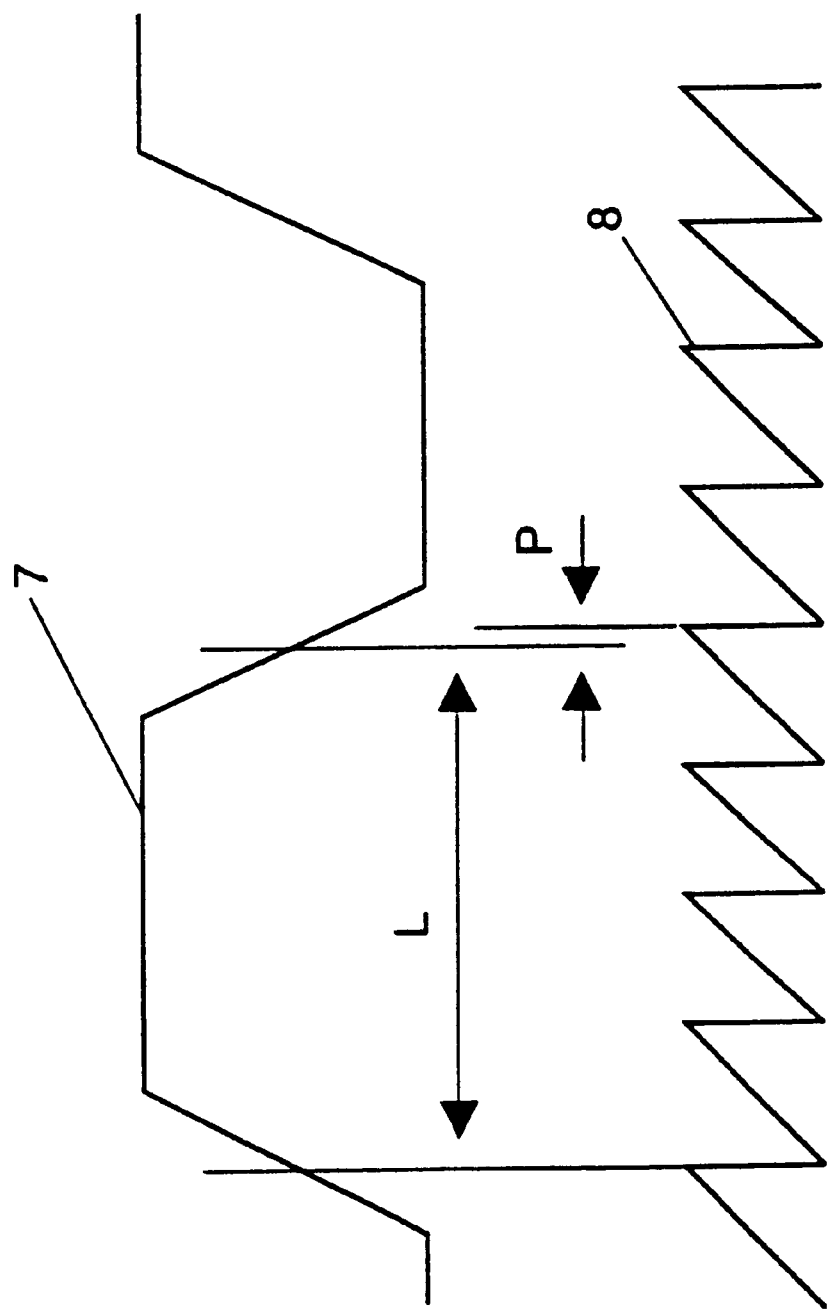
FIG. 2 shows the clock signal of the PLL and also the input data stream.

FIG. 2 shows, in a simplified form, the signals that are present, namely the EFM signal, as it arrives from the CD, in the upper part and the clock signal of the oscillator, which must be synchronized with the signal, in the lower part. The definition of the pulse length L and also the phase angle P of each edge relative to the VCO clock signal edge are also illustrated. In this case, the separation between two edges, that is to say the pulse length L, is precisely determined to whole numbers and fractions of a clock period of the PLL oscillator. The phase angle P is determined in fractions of the clock period of the PLL oscillator.

Figure 3:
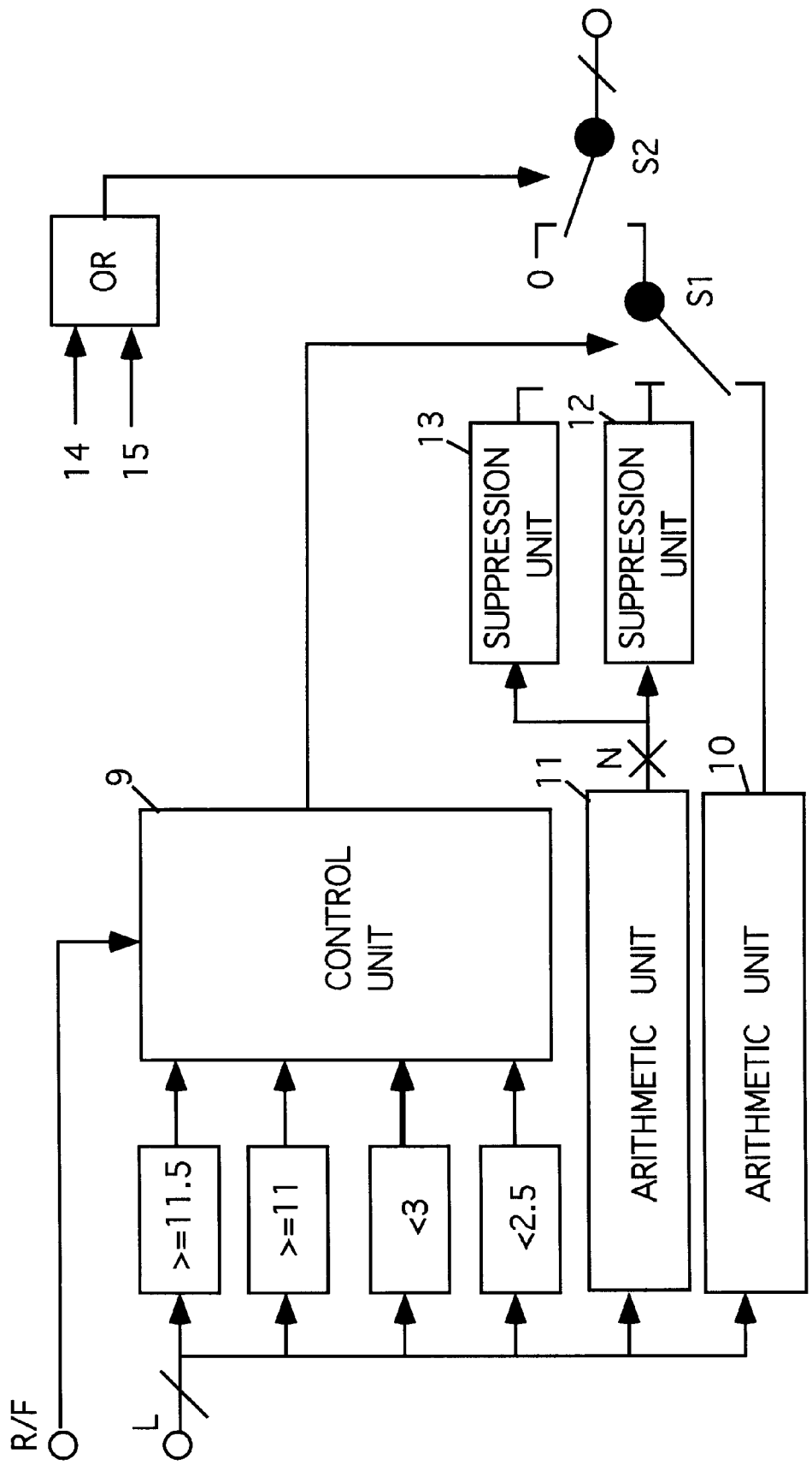
FIG. 3 shows the pulse length detector according to the invention.

FIG. 3 shows the basic circuit diagram of the pulse length detector 2 of FIG. 1. As already explained, L indicates the length of the last pulse of the EFM data. The range L equals [0; . . . 15 15/16] is preferably realized. The value L is realized as an 8-bit fixed point number, 4 bits being allocated to the whole number part (0 . . . 15) and 4 bits (LSB) being allocated for describing 16ths of an oscillator clock period. Other values are conceivable. If a 16-bit resolution has been selected, with 8 bits for the whole number and 8 bits for the fractions, the value range is [0; . . . 255 255/256]. Four simple comparisons are carried out, the results of which influence a control mechanism 9, that is to say a switch S1, which selects which output signal the pulse length detector generates, is switched as a function of the comparison results. In the normal case, the control mechanism 9 selects the lowest position of the switch S1. In this position, the difference between the pulse length and the nearest whole number is calculated in an arithmetic unit 10 and output. Examples are listed in Table 1 below, the table being based on the value range [0, . . . ,15 15/16].

TABLE 1

| L | Output values |
|---|---|
| 3 4/16 | + 4/16 |
| 2 4/16 | + 4/16 |
| 15 4/16 | + 4/16 |
| 9 7/16 | + 7/16 |
| 4 8/16 | − 8/16 |
| 5 9/16 | − 7/16 |
| 7 15/16 | − 1/16 |

If the comparisons reveal that the pulse length 11.5 is exceeded, to be precise in each case once for a positive and a negative pulse (R edge, F edge) during a finite time, then the middle position of the switch S1 is selected. In this state, an arithmetic unit 11 calculates the difference from the nearest whole number, the range of this whole number being limited to 3 . . . 11. Examples of this are given in Table 2 below:

TABLE 2

| L | Output values |
|---|---|
| 3 4/16 | + 4/16 |
| 2 4/16 | − 12/16 |
| 15 4/16 | + 68/16 |
| 9 7/16 | + 7/16 |
| 4 8/16 | − 8/16 |
| 5 9/16 | − 7/16 |
| 7 15/16 | − 1/16 |

In addition, a suppression unit 12 sets all negative differences to zero when the switch is in the middle position.

The upper position of the switch S1 is selected when the comparison reveals that the pulse length is less than 2.5, to be precise in each case once for a positive and a negative pulse during a finite time. In this case, the arithmetic unit 11 likewise calculates the difference between the pulse length and the nearest whole number, the whole number once again being limited to the range from 3 to 11, but now all positive deviations of the arithmetic unit 11 being set to zero by a further suppression unit 13.

In addition, in the two upper positions of the switch S1, the result of the calculation is multiplied by an amplification factor n before entering the corresponding suppression unit 12, 13. In other words, only the positive pulse length deviations are seen in the middle position of the switch S1, while the negative pulse length deviations are recognized in the upper position of S1. Since, as emerges from Table 2, small and large deviations result in large output values at the pulse length detector, in the event of deviations of this type, together with the amplification factor n, a large output signal is generated by the pulse length detector for the purpose of controlling the oscillator frequency. In other words, in the event of deviations of this type, the intention is to produce a large change in the oscillator frequency in order to bring the control back into the normal range (lower switch position) once more. The two upper switch positions of the switch S1 are reversed the first time, for long pulses, a pulse is found which has a length of <3 or has a length of ≧11 in the case of short pulse regulation. In such a case, the "accelerated" regulation position of the switch S1 (upper or middle) is left and the switch is reset to the lowest position.

Clearly this means, when the oscillator has an excessively high frequency, that the EFM pulse signal appears proportionally to be too long, since its length is described in periods of the oscillator signal. Accordingly, the regulation effects rapid reduction. The situation is similar when the disk rotates relatively slowly. The signal of the disk is then prolonged in time, with the result that the pulses likewise appear to be long. In both cases, the intention is to reduce the oscillator frequency in order that a recorded disk pulse having a length of n×T actually has a length of n oscillator clock periods.

If the PLL has locked on, that is to say the oscillator clock signal is in synchronism with the EFM pulses, this is indicated by the signal 14. The output signal of the pulse length detector 1 is then set to zero by a second switch S2, that is to say regulation does not take place. This case can also arise when the defect signal 15 is set.

The regulation is not limited to the parameters selected, other representations of the pulse length L with more bits, for example, are conceivable, which means that the numerical ranges have to be modified in this case.

We claim:

1. A method for controlling retuning operation of a phase locked loop (PLL) oscillator frequency which is used for recovering the bit timing of a data stream, comprising the steps:

determining a phase of an oscillator signal of said PLL relative to said data stream signal in fractions of a clock period of said PLL oscillator;

determining a pulse length of pulses within said data stream signal in units of said clock period of said PLL oscillator;

determining a deviation of said pulse length compared to a next nearest whole pulse length number;

adding said determined phase and said deviation to produce sum values, wherein said adding step comprises the steps:

integrating said sum values to produce an integrated value, said integrated value being used as a retuning value for said oscillator frequency of said PLL;

distinguishing at least three cases for retuning control, said cases being:

a) when pulses in said data stream signal exceed a given length in a predefined time, then only positive deviation values are used for retuning control to reduce said oscillator frequency;

b) when pulses in said data stream signal fall below a given length in a predefined time, then only negative deviation values are used for retuning control to increase said oscillator frequency;

c) when pulse lengths in said data stream signal are within an allowed range, then positive and negative deviations are used for retuning control to fine tune said oscillator frequency.

2. A digital detector circuit of a phase-locked loop (PLL) for recovering the bit timing of a data stream signal, said detector circuit comprising:

a digital phase detector which determines a phase of an oscillator signal of said PLL relative to said data stream signal in fractions of a clock period of said PLL oscillator;

a digital pulse length analysing circuit which determines a pulse length (L) of said data stream signal in units of said clock period of said PLL oscillator, said pulse length being over an interval 0 to Max, where Max is a rational number;

an adder for adding output values of said digital phase detector and said digital pulse length analysing circuit to produce sum values; and an integrator for integrating said sum values, a result of said integrator forming a retuning value for said PLL oscillator; wherein said pulse length analysing circuit has a control mechanism by means of which, depending on a predetermined function F(L), said pulse length analysing circuit outputs one of the following signals:

a) a difference value between said determined pulse length and a nearest whole number of said interval 0 to Max;

b) a difference value between said determined pulse length and a nearest whole number of a restricted interval Max2 to Min2, where Max2 and Min2 are rational numbers;

wherein said output a) forms a presetting;

depending on said predetermined function F(L), in the case of the output b), in addition, either b1) all positive elements of said difference determined in b) are set to zero, or b2) all negative elements of said difference determined in b) are set to zero;

the predetermined function F(L) performs four comparisons with thresholds Max1, Max2, Min1 and Min2, namely whether the following is true for said pulse length, where Max1 and Min1 are rational numbers:

c1) L≧Max1
   c2) L≧Max2
   c3) L<Min2
   c4) L<Min1, and said decision b1) is selected when said pulse length satisfies condition c1) during a predetermined finite time, said decision b2) is selected when said pulse length satisfies condition c4) during a predetermined finite time;

when state b1) occurs, decision a) is selected again the first time c3) is detected for said pulse length, and when state b2) occurs, decision a) is selected again the first time c2) is detected for said pulse length.

3. The detector circuit according to claim 2, wherein said condition c1) or c2) must be satisfied in each case once for a positive and a negative pulse of said pulse length during said predetermined finite time.

4. The detector circuit according to claim 2, wherein said pulse length is realized as an 8-bit fixed point number.

5. The detector circuit according to claim 4, wherein 4 bits of said pulse length are determined for the whole number part and 4 bits of said pulse length are determined for the 1/16ths of an oscillator clock period.

6. The detector circuit according to claim 5, wherein: Max=15 15/16, Max1=11.5, Max2=11, Min2=3 and Min1=2.5.

7. The detector circuit according to claim 6, wherein said output signal of said pulse length analysing circuit is multiplied by an amplification factor when a difference from the next whole number between 3 and 11 is output.

8. The detector circuit according to claim 2, wherein said pulse length analysing circuit outputs the value zero when a defect has been detected and when said entire PLL is synchronized.

9. The detector circuit according to claim 2, wherein said pulse length analysing circuit is controllable.

10. The detector circuit according to claim 2, wherein after adding said phase value and the output of said pulse length analysing circuit, this result is multiplied by −1.

* * * * *